United States Patent
Sugimoto et al.

[11] Patent Number: 5,994,218
[45] Date of Patent: *Nov. 30, 1999

[54] METHOD OF FORMING ELECTRICAL CONNECTIONS FOR A SEMICONDUCTOR DEVICE

[75] Inventors: Shigeki Sugimoto; Katsuya Okumura, both of Yokohama, Japan

[73] Assignee: Kabushiki Kaisha Toshiba, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/724,735

[22] Filed: Sep. 30, 1996

[51] Int. Cl.⁶ .................................................. H01L 21/28
[52] U.S. Cl. .................. 438/660; 438/629; 438/638; 438/688; 438/768; 257/765; 257/771
[58] Field of Search .................................. 438/688, 661, 438/691, 660, 649, 629, 763, 768, 625, 666, 647, 638; 257/765, 770, 771

[56] References Cited

U.S. PATENT DOCUMENTS

| | | | |
|---|---|---|---|
| 3,740,835 | 6/1973 | Duncan | 438/654 |
| 3,918,149 | 11/1975 | Roberts | 438/657 |
| 4,471,376 | 9/1984 | Morcom et al. | 257/763 |
| 4,538,344 | 9/1985 | Okumura et al. | 438/657 |
| 5,093,279 | 3/1992 | Andreshak et al. | 437/173 |
| 5,250,467 | 10/1993 | Lee | 438/643 |
| 5,355,020 | 10/1994 | Lee et al. | 257/741 |
| 5,413,962 | 5/1995 | Lur et al. | 438/619 |
| 5,497,017 | 3/1996 | Gonzales | 257/306 |
| 5,567,987 | 10/1996 | Lee | 257/751 |
| 5,578,523 | 11/1996 | Fiordalice et al. | 438/633 |

FOREIGN PATENT DOCUMENTS

| | | |
|---|---|---|
| 2-199838 | 8/1990 | Japan . |
| 2199836 | 8/1990 | Japan . |
| 5-62456 | 9/1993 | Japan . |

*Primary Examiner*—John F. Niebling
*Assistant Examiner*—Ha Tran Nguyen
*Attorney, Agent, or Firm*—Banner & Witcoff, ltd.

[57] ABSTRACT

A silicon film is deposited using low pressure chemical vapor deposition (LPCVD) to fill in openings formed in a substrate such as an insulating film. An aluminum film and a metal film are then formed on the silicon film. A thermal process is then carried out. This thermal process causes the deposited aluminum to replace the silicon in the openings because the silicon migrates to the metal and forms a metal silicide film. The aluminum which replaces the silicon in the openings has few or no voids. The metal silicide film any remaining portion of the aluminum film are then removed using CMP, for example.

24 Claims, 7 Drawing Sheets

METHOD OF FORMING ELECTRICAL CONNECTIONS FOR A SEMICONDUCTOR DEVICE

BACKGROUND OF THE INVENTION

1. Technical Field

The present invention generally relates to a method of forming electrical connections for a semiconductor device and, more particularly, to a method of forming electrical connections for a highly integrated semiconductor device.

2. Description of Related Art

Various processes are used in the fabrication of semiconductor devices in order to form the electrical connections between the device elements and the wirings for connecting the device to external devices. For example, multilevel metallization processes have been found to be useful for simplifying the fabrication of large scale integrated (LSI) devices. Such processes may be carried out to simultaneously form a wiring layer and a contact. One such multilevel metallization process is a so-called "dual damascene" process. A dual damascene process will be generally described with reference to FIGS. 1(a)–1(g). FIG. 1(a) shows a plurality of first level conductive structures 10 which are formed on an insulating film 7 which is formed on a silicon substrate 5. Conductive structures 10 may, for example, be formed of aluminum (Al), tungsten (W), tungsten silicide ($WSi_x$), molybdenum silicide ($MoSi_x$), titanium silicide ($TiSi_x$), and the like. These conductive structures may, for example, be wirings, gate electrodes, bit lines, or lower level metallizations in a multi-metallization arrangement. As shown in FIG. 1(a), an insulating film 35 of silicon dioxide, for example, is formed on semiconductor substrate 5 and conductive structures 10. A first patterned resist film 40 is then formed as shown in FIG. 1(b) and a contact hole 45 which exposes one of the conductive structures 10 is formed by using an etching process such as reactive ion etching (RIE), for example, for etching insulating film 35 as shown in FIG. 1(c). A second patterned resist film 50 is then formed as shown in FIG. 1(d) and a wiring trench 55 is subsequently formed by an etching process such as RIE, for example, for etching insulating film 35 as shown in FIG. 1(e). Next, an aluminum film 60 is formed by sputtering as shown in FIG. 1(f). Aluminum film 60 is then polished by chemical mechanical polishing (CMP) as shown in FIG. 1(g). CMP is a combination of mechanical and chemical abrasion, and may be performed with an acidic or basic slurry. Material is removed from the wafer due to both the mechanical buffing and the action of the acid or base.

The damascene metallization process described above forms highly reliable wirings and contacts and provides good planarity of interlevel dielectric layers. As the integration density of semiconductor devices increases, the thickness of wirings generally decreases more slowly than the width of the wirings. Also, the thickness of contacts generally either does not change or decreases more slowly than the widths of the contacts as the integration density increases. As a result, the aspect ratio (i.e., depth/width) of wiring trenches and of contact or through holes formed in insulating films increases and high aspect ratio filling processes are required. In conventional metallization processes for forming wirings and contacts for semiconductor devices such as the process described above, an aluminum film is deposited using a sputtering method to fill the wiring trench/contact hole. The excess aluminum is then removed using CMP, for example. Aluminum is widely used for interconnects and wiring layers in semiconductor devices because of its low resistivity and ease of fabrication. However, the step coverage of an aluminum sputtering process is ineffective for filling without voids wiring trenches and/or contact holes having a high aspect ratios. Even using the long throw sputtering method for aluminum described in *J. Vac. Sci. Tech.*, B13(4), July/August 1995 (pp. 1906–1909) or the reflow sputtering method for aluminum, only wiring trenches and/or contact holes with aspect ratios less than about 2 generally can be filled without voids. The presence of voids in aluminum wirings and contacts degrades the reliability of the wirings and contacts and adversely affects the performance of the semiconductor device.

SUMMARY OF THE INVENTION

In accordance with the present invention, a silicon film is deposited using low pressure chemical vapor deposition (LPCVD) to fill in openings formed in a substrate such as an insulating film. "Openings" broadly refers to contact holes, through holes, trenches, vias, and the like. Such silicon films have good step coverage and can fill in high aspect ratio openings with few or no voids. An aluminum film and a metal film are then formed (by sputtering, for example) on the silicon film and a thermal process or annealing is carried out. This thermal process causes the deposited aluminum to replace the silicon in the openings. The silicon migrates to the metal and forms a metal silicide film. The aluminum which replaces the silicon in the openings has few or no voids. The metal silicide film and any remaining portion of the aluminum film are then removed using CMP, for example. The removal of the high resistivity silicide layer leaves only low resistivity aluminum in the opening. Using the techniques of the present invention, openings having a high aspect ratio (e.g., greater than about 3) can be filled with aluminum without voids.

The features and advantages of the present invention will be better understood from a reading of the following detailed description in conjunction with the accompanying drawings.

DETAILED DESCRIPTION

The electrical connection formation process of the present invention will be explained with reference to FIGS. 2(a)–2(j). The process description below will be given with respect to a process for forming a multilevel metallization structure usable in semiconductor devices such as logic circuits and semiconductor memory devices including dynamic random access memories (DRAMs), static random access memories (SRAMs), and the like. However, the process of the present invention is not limited in this respect and it will be apparent that the inventive process may be applied to other single level or multilevel processes for forming electrical connections such as contacts and wirings for semiconductor devices. As will become apparent from the description below, the present invention is particularly well-suited for a so-called damascene process for filling trenches and/or contact holes since such a damascene process removes any high resistivity films which are formed on the surface of the substrate in which the trenches and/or contact holes are formed. The removal of these high resistivity films leaves only a low resistivity film such as aluminum in the trenches and/or contact holes.

Figure 1A:
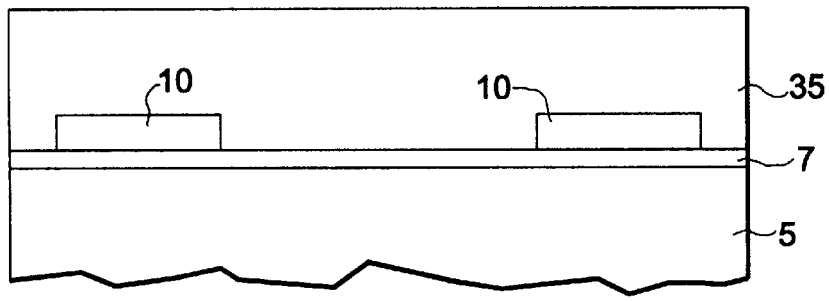
FIGS. 1(a)–1(g) illustrate a conventional process for forming a multilevel electrical connection.
Figure 1B:
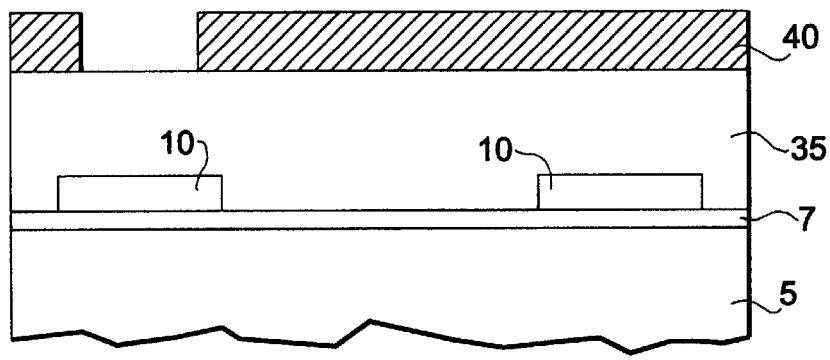
Figure 1C:
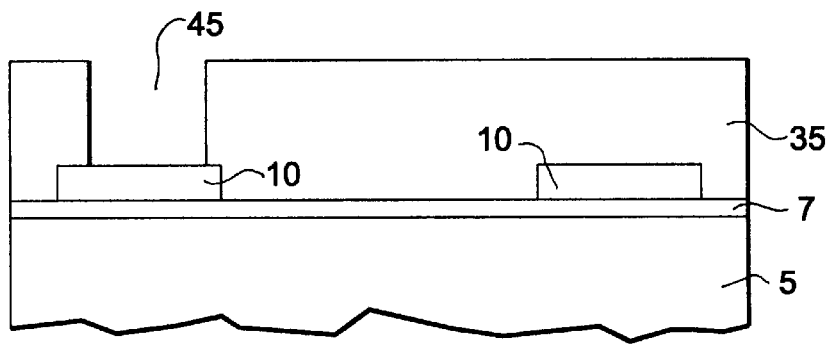
Figure 1D:
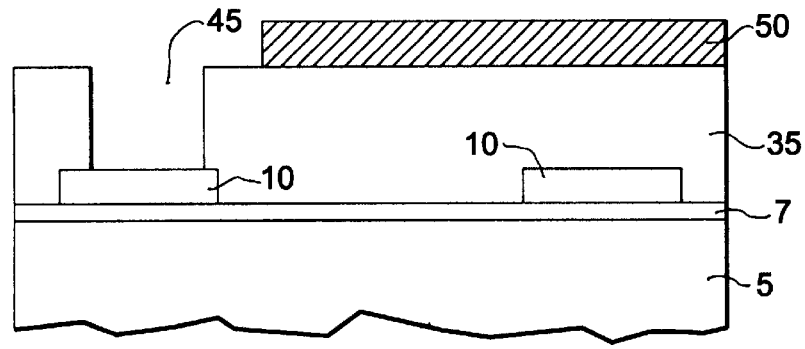
Figure 1E:
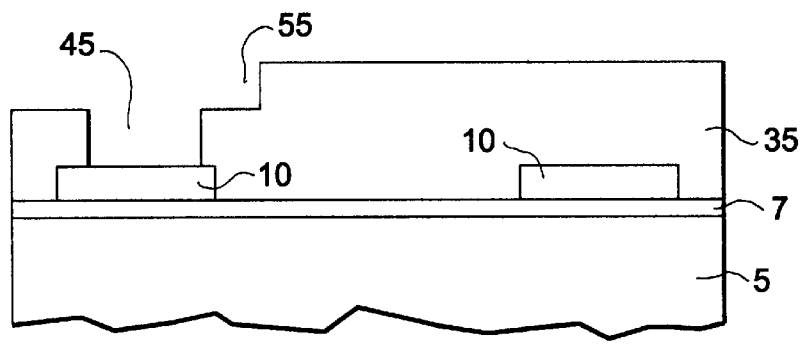
Figure 1F:
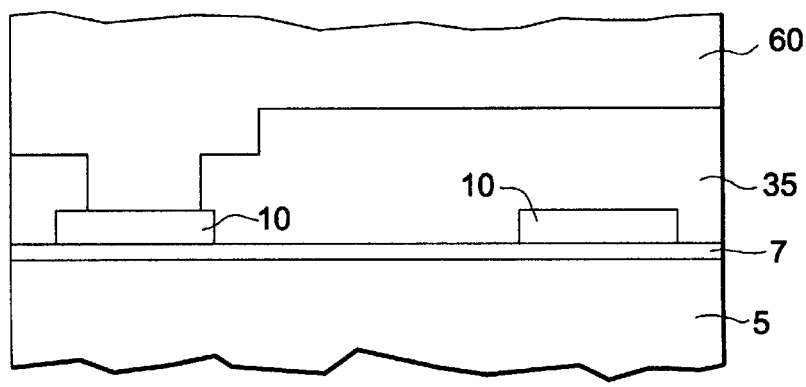
Figure 1G:
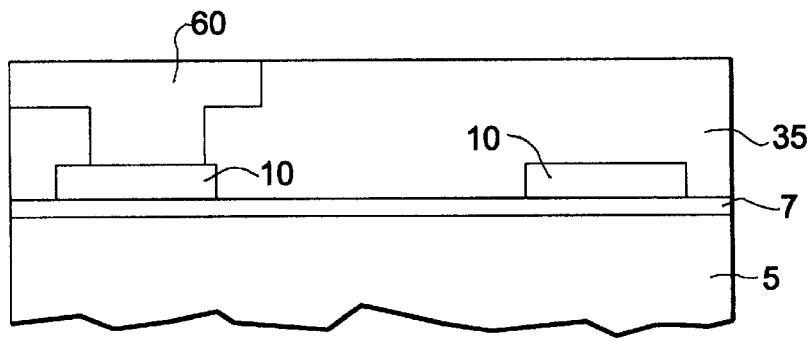
Figure 2A:
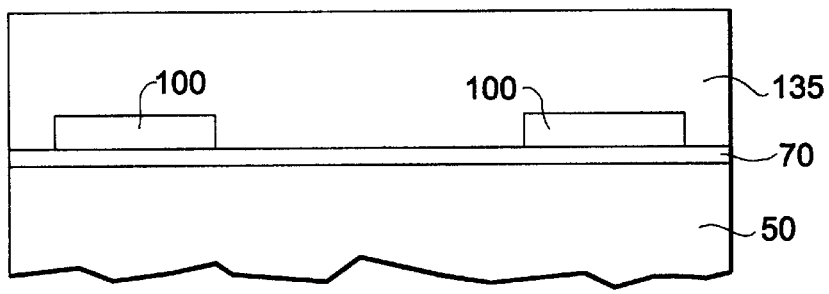
FIGS. 2(a)–2(j) illustrate the electrical connection forming method of the present invention.
Figure 2B:
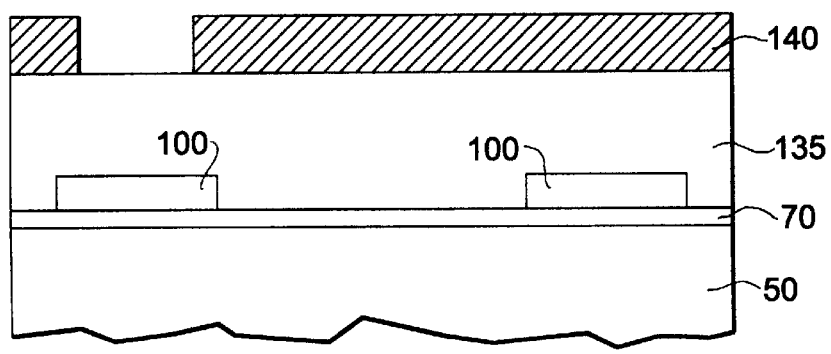
Figure 2C:
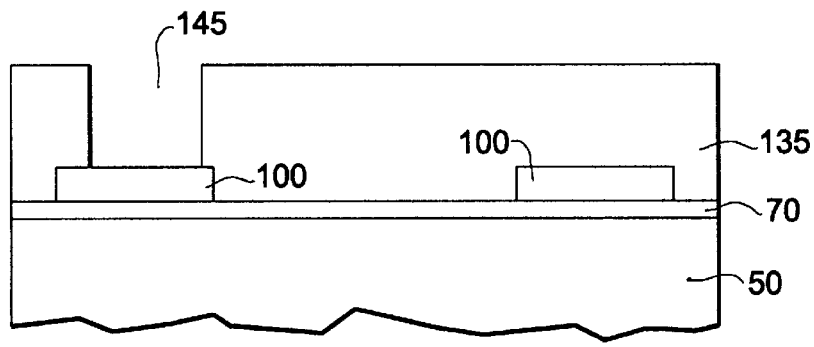
Figure 2D:
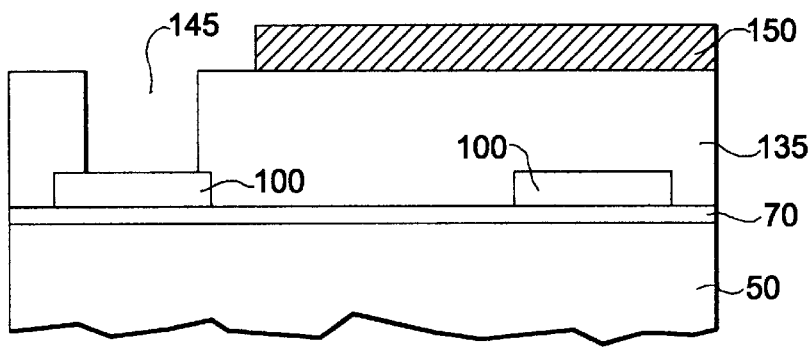
Figure 2E:
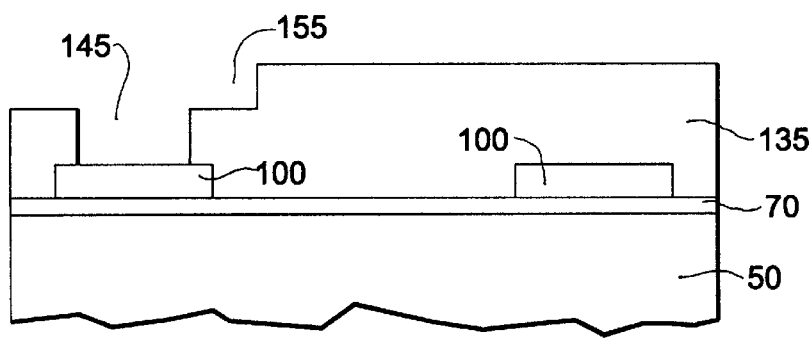

With reference to FIG. 2(a), an insulating film 70 of silicon dioxide ($SiO_2$), for example, is formed on a substrate 50 of silicon (Si). Other substrates may be utilized and the invention is not limited in this respect. Wirings 100 are then formed on insulating film 70. An insulating film 135 of silicon dioxide, for example, is then formed on wirings 100 and insulating film 70. A first patterned resist film 140 is then formed as shown in FIG. 2(b) and a contact or through hole 145 which exposes one of the wirings 100 is formed by using an etching process such as reactive ion etching (RIE), for example, for etching insulating film 135 as shown in FIG. 2(c). A second patterned resist film 150 is then formed as shown in FIG. 2(d) and a wiring trench 155 is subsequently formed by an etching process such as RIE, for example, for etching insulating film 135 as shown in FIG. 2(e). It will be appreciated that the dimensions and orientations of the contact holes and/or the wiring trenches to which the present invention is applied will be dependent upon the particular circuit design.

Figure 2F:
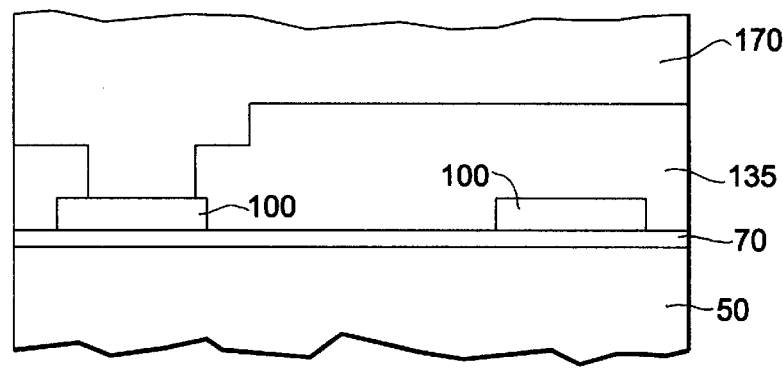
Figure 2G:
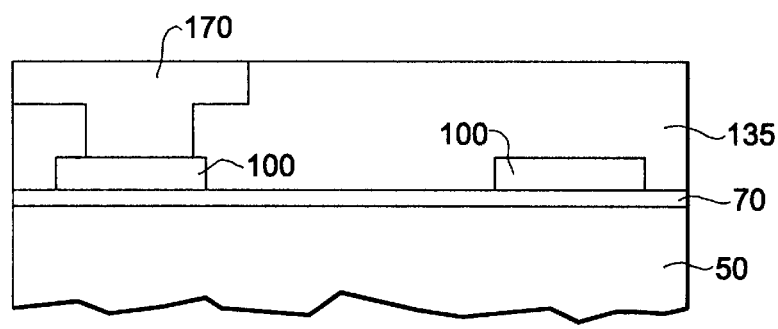

Next, a film 170 of amorphous silicon is deposited on the substrate using LPCVD as shown in FIG. 2(f). Film 170 may also be formed of single crystal silicon or polysilicon. However, amorphous silicon is advantageous because amorphous silicon migrates more easily during annealing than single crystal silicon and polysilicon. Thus, using amorphous silicon requires lower annealing temperatures or shorter annealing times. If desired, a silicon film doped with an impurity such as boron may be deposited. Such a doped silicon film can be deposited at a lower deposition temperature than an undoped silicon film. In particular, such a lower deposition temperature is advantageous in the case where wirings 100 are formed of aluminum since a temperature lower than about 500° C. is necessary. In order to fill contact holes, the thickness of amorphous silicon film 170 must be greater than half of the diameter of the largest contact hole to be filled. In order to fill wiring trenches, the thickness of amorphous silicon film 170 must be greater than the wiring trench depth. In general, the wiring trench depth is the dominant factor in determining the thickness of the silicon film to be used. After forming amorphous silicon film 170, a CMP process, for example, is performed so that amorphous silicon remains only in wiring trench 155 and contact hole 145 as shown in FIG. 2(g).

Figure 2H:
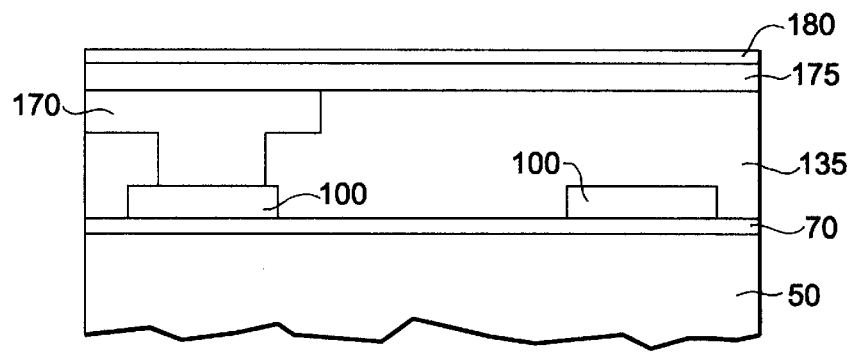

Next, a film 175 of aluminum and a film 180 of titanium are successively formed by sputtering or CVD as shown in FIG. 2(h). Film 180 is not limited to being formed of titanium and may also be formed of metals such as tungsten (W), molybdenum (Mo), tantalum (Ta), cobalt (Co), platinum (Pt), hafnium (Hf), or nickel (Ni). The thicknesses of films 175 and 180 are dependent on the volume of the amorphous silicon which fills wiring trench 155 and contact hole 145. Specifically, since the aluminum will replace the amorphous silicon in wiring trench 155 and contact hole 145 as will be described below, aluminum film 175 should have a thickness which results in the total volume of aluminum being equal to or greater than the total volume of silicon which will be replaced. In addition, titanium film 180 should have a thickness which results in a total volume of titanium sufficient for reacting with all of the amorphous silicon which migrates to film 180 during annealing to form titanium silicide.

Figure 2I:
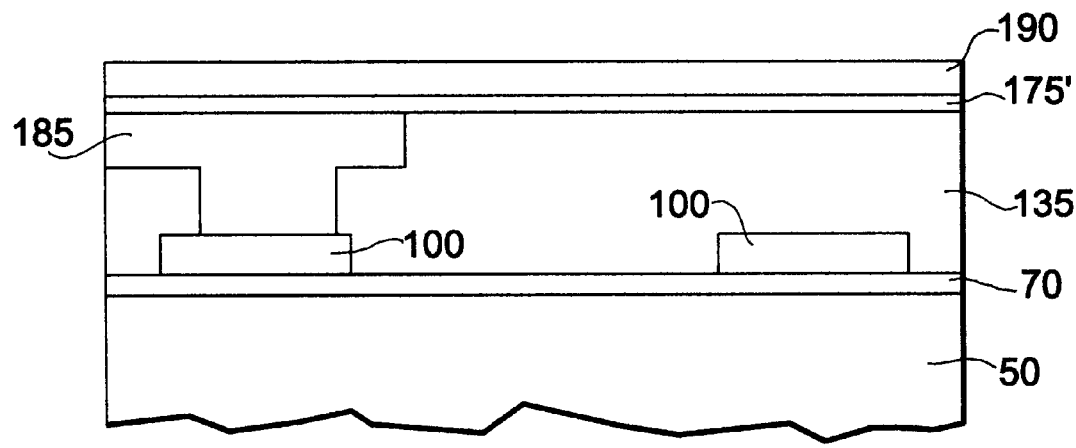
Figure 2J:
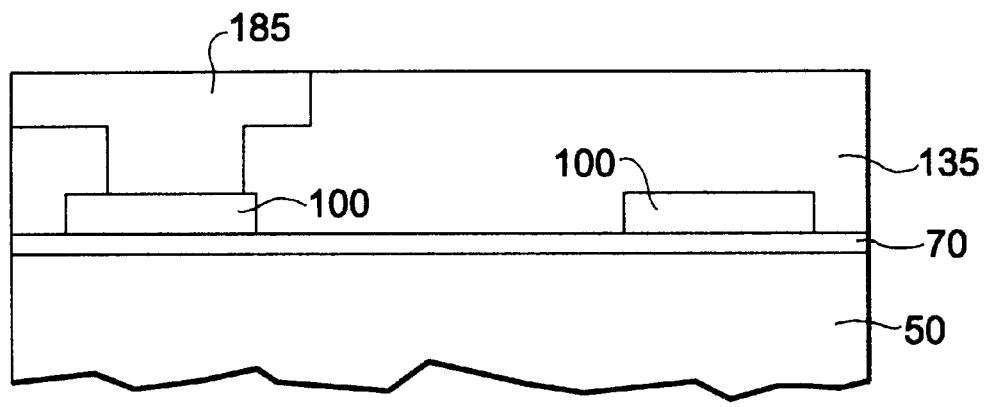

The substrate is then annealed in a furnace at a temperature of about 450° C. with a forming gas of $N_2$ containing 10% $H_2$. Other anneals such as a hydrogen ($H_2$), argon (Ar), nitrogen ($N_2$), or vacuum anneal may be used, if desired. The rate of replacing the amorphous silicon with aluminum from aluminum film 175 is determined by the diffusion rates of silicon and aluminum. A lower annealing temperature will require a longer annealing time and a higher annealing temperature will require a shorter annealing time. The total amorphous silicon volume and the contact hole/wiring trench depth also affect the annealing temperature/time. Thus, a large amorphous silicon volume and/or a deep contact hole/wiring trench structure will require a longer annealing time or a higher annealing temperature. Although it will be understood that the annealing temperature depends on these and other factors, it is presently believed that the annealing temperature may be in range from about 350° C. to about 550° C. It should be noted that if the underlying wirings 100 are aluminum wirings, the annealing temperature should be 500° C. or less. During the annealing process, the amorphous silicon in contact hole 145 and wiring trench 155 migrates to titanium film 180 and forms a film 190 of titanium silicide at the top of the substrate as shown in FIG. 2(i). Film 190 will also contain some aluminum atoms. In addition, aluminum from aluminum film 175 migrates into contact hole 145 and wiring trench 155 to replace the silicon. As a result, wiring trench 155 and contact hole 145 are filled with an aluminum layer 185. More specifically, during the anneal, silicon atoms from the amorphous silicon in the contact hole/wiring trench are diffused into aluminum film 175. At the same time, aluminum atoms from aluminum film 175 are diffused into the amorphous silicon. The silicon atoms that reach titanium film 180 combine with titanium atoms and form titanium silicide film 190. Titanium silicide is very stable at the annealing temperature and thus the silicon atoms which combine with the titanium atoms do not further diffuse or migrate. After sufficient annealing, all the silicon atoms will have combined with titanium atoms of titanium film 180 to form titanium silicide film 190. In cases where not all of the aluminum from aluminum film 175 migrates to the contact hole/wiring trench, an aluminum film 175' remains under titanium silicide film 190 as shown in FIG. 2(i). Titanium silicide film 190 and the remaining aluminum film 175' are then removed using CMP, for example, as shown in FIG. 2(j) so that aluminum layer 185 fills in contact hole 145 and wiring trench 155.

In the process of the present invention as described above, a wiring trench and a contact hole are initially filled with amorphous silicon which has excellent step coverage. Aluminum then replaces the amorphous silicon during an annealing process. In accordance with this process, high aspect ratio wiring trenches and contact holes can be filled with aluminum having few or no voids to provide a layer having low resistivity and high reliability. In addition, since the above-described process is a damascene process in which the high resistivity silicide film 190 (and any remaining aluminum) on the insulating film 135 are removed, only a low resistivity material such as aluminum remains in the wiring trenches and/or contact holes. In this way, for example, thin layers having low resistivity may be formed.

Figure 3:
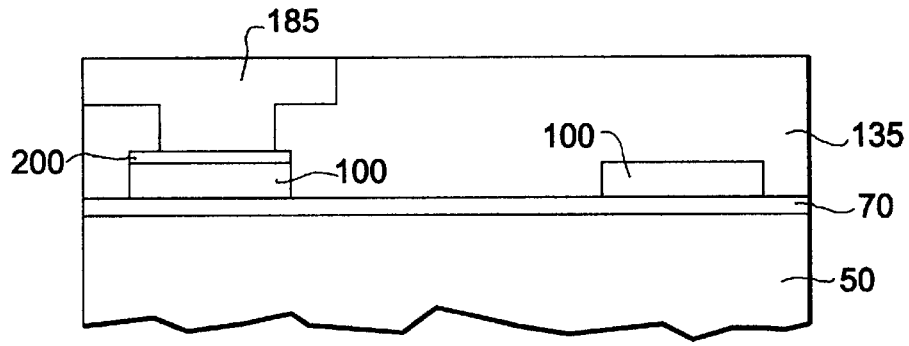
FIGS. 3, 4, and 5 illustrate electrical connections formed in accordance with variations of the process of FIGS. 2(a)–2(j).

In accordance with a first variation of the above-described process, a film 200 of titanium nitride having a thickness of about 10 nanometers may be formed by sputtering or CVD on top of wiring layer 100 as shown in FIG. 3 if wiring layer 100 is formed of aluminum. In a high aspect ratio case, it is preferable that film 200 be formed by CVD. Film 200 may be formed of other materials such as tungsten nitride. Film 200 serves to prevent the amorphous silicon from silicon film 170 from diffusing into aluminum wiring 100.

Figure 4:
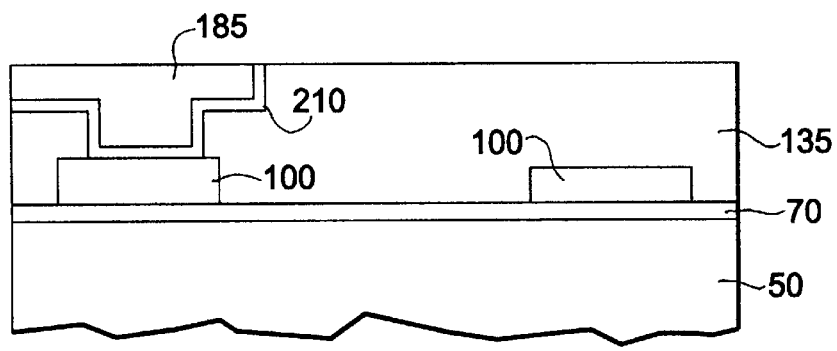

In accordance with a second variation of the above-described process of FIGS. 2(a)–2(j), a film 210 of titanium nitride may be deposited by sputtering or CVD prior to the deposition of the amorphous silicon film 170 in FIG. 2(f). Film 210 may be formed of other materials such as tungsten nitride. In a high aspect ratio case, it is preferable that film 210 be formed by CVD. Film 210 remains on contact hole and wiring trench bottom and sidewalls as shown in FIG. 4 and thereby improves the of the electrical connection reliability.

Figure 5:
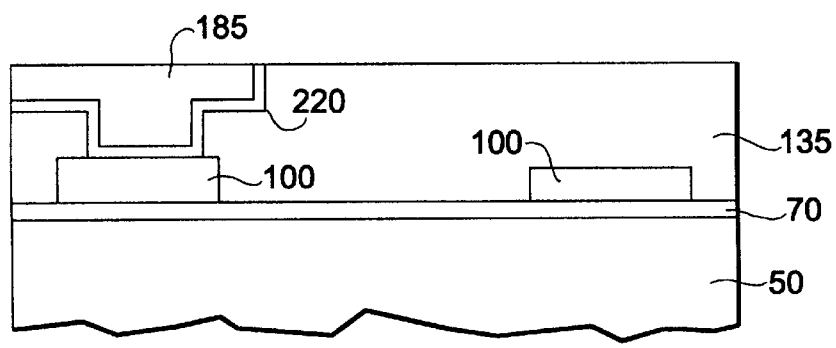

In accordance with a third variation of the above-described process of FIGS. 2(a)–2(j), a film of titanium or tungsten, for example, may be deposited by sputtering or CVD prior to the deposition of the amorphous silicon film 170 in FIG. 2(f). In a high aspect ratio case, it is preferable that the film be formed by CVD. A $TiSi_x$ or $WSi_x$ film will be formed on contact hole and wiring trench bottom and sidewalls during the annealing. Thus, a layer 220 of $TiSi_x$ or $WSi_x$ will remain as shown in FIG. 5. Layer 220 also improves the reliability of the electrical connection.

While there has been shown and described the preferred embodiments of the invention, it will be evident to those skilled in the art that various modifications may be made thereto without departing from the spirit and scope of the invention which is set forth in the appended claims.

I claim:

1. A method of filing a wiring trench formed in an insulating film, comprising the steps of:
    forming a wiring trench in an insulating film;
    depositing a silicon film on said insulating film, which fills said wiring trench;
    removing said silicon film on said insulating film to leave said silicon film only in said wiring trench;
    forming an aluminum film on said silicon film and said insulating film;
    forming a metal film on said aluminum film;
    performing a thermal process to cause aluminum from said aluminum film to migrate and replace the silicon film in said wiring trench and to cause silicon from said silicon film to migrate to said metal film and react to form a metal silicide film; and
    removing completely said metal silicide film and any remaining unmigrated portion of said aluminum film from a surface of said insulating film to leave said aluminum film only in said wiring trench.

2. The method according to claim 1, wherein said silicon is deposited using low pressure chemical vapor deposition.

3. The method according to claim 1, wherein said silicon film is an amorphous silicon film.

4. The method according to claim 1, wherein said aluminum film is formed by sputtering.

5. The method according to claim 1, wherein said metal film is formed by sputtering.

6. The method according to claim 1, wherein said metal film is a titanium film.

7. The method according to claim 1, wherein metal film is formed from a metal selected from the group consisting of tungsten (W), molybdenum (Mo), tantalum (Ta), cobalt (Co), platinum (Pt), hafnium (Hf), and nickel (Ni).

8. The method according to claim 1, wherein the thermal process is performed at a temperature in a range from about 350° C. to about 550° C.

9. The method according to claim 1, wherein the thermal process is performed at a temperature less than 500° C.

10. The method according to claim 1, wherein said metal silicide and remaining unmigrated portion of said aluminum film are removed by chemical mechanical polishing.

11. The method according to claim 1, wherein said opening has an aspect ratio of at least 3.

12. The method according to claim 1, wherein said removing steps are performed by a chemical mechanical polishing.

13. A method of forming a connection to a wiring layer comprising the steps of:
    forming a first wiring layer on a first insulating film;
    forming a second insulating film on said first wiring layer and said first insulating film;
    forming an opening in said second insulating film to expose a portion of said first wiring layer;
    forming a wiring trench communicating to said opening in said second insulating film;
    forming a first metal layer at least on said first wiring layer;
    depositing a silicon film on said second insulating film, which fills said opening and wiring trench;
    removing said silicon film on said second insulating film to leave said silicon film in said opening and said wiring trench;
    forming an aluminum film on said silicon film and said second insulating film;
    forming a second metal film on said aluminum film;
    performing a thermal process to cause aluminum from said aluminum film to migrate and replace the silicon film in said opening and said wiring trench and to cause silicon from said silicon film to migrate to said second metal film and react to form a metal silicide film; and
    removing completely said metal silicide film and any remaining unmigrated portion of said aluminum film from a surface of said second insulating film to leave said aluminum film only in said opening and said wiring trench as a connection and a second wiring layer.

14. The method according to claim 13, wherein said silicon film is an amorphous silicon film.

15. The method according to claim 13, wherein said silicon film is a doped silicon film.

16. The method according to claim 13, wherein said metal film is a titanium film.

17. The method according to claim 13, wherein metal film is formed from a metal selected from the group consisting of tungsten (W), molybdenum (Mo), tantalum (Ta), cobalt (Co), platinum (Pt), hafnium (Hf), and nickel (Ni).

18. The method according to claim 13, wherein said wiring layer is an aluminum wiring layer.

19. The method according to claim 18, wherein the thermal process is performed at a temperature less than 500° C.

20. The method according to claim 13, wherein said removing steps are performed by a chemical mechanical polishing.

21. A method of filling a wiring trench and a contact hole communicating to the wiring trench formed in an insulating film, comprising the steps of:
    forming a first wiring layer on a first insulating film;
    forming a second insulating film on said first wiring layer and said first insulating film;
    forming a contact hole in said second insulating film to expose a portion of said first wiring layer;
    forming a wiring trench communicating to said opening in said second insulating film;
    depositing a silicon film on said second insulating film, which fills said wiring trench and said contact hole;

removing said silicon film on said second insulating film to leave said silicon film only in said wiring trench and said contact hole;

forming an aluminum film on said silicon film and said second insulating film;

forming a metal film on said aluminum film;

performing a thermal process to cause aluminum from said aluminum film to migrate and replace the silicon film in said wiring trench and said contact hole and to cause silicon from said silicon film to migrate to said metal film and react to form a metal silicide film; and removing said metal silicide film and any remaining unmigrated portion of said aluminum film from a surface of said second insulating film to leave said aluminum film in said wiring trench and said contact hole.

22. The method according to claim 21, wherein said removing steps are performed by a chemical mechanical polishing.

23. A method of forming a connection between first and second wiring layers comprising the steps of:

forming a first wiring layer on a first insulating film;

forming a first metal layer on said first wiring layer;

forming a second insulating film on said first metal layer and said first insulating film;

forming an opening in said second insulating film to expose a portion of said first metal layer;

forming a wiring trench communicating to said opening in said second insulating film;

depositing a silicon film on said second insulating film, which fills said opening and wiring trench;

removing said silicon film on said second insulating film to leave said silicon film in said opening and said wiring trench;

forming an aluminum film on said silicon film and said second insulating film;

forming a second metal film on said aluminum film;

performing a thermal process to cause aluminum from said aluminum film to migrate and replace the silicon film in said opening and said wiring trench and to cause silicon from said silicon film to migrate to said second metal film and react to form a metal silicide film; and removing completely said metal silicide film and any remaining unmigrated portion of said aluminum film from a surface of said second insulating film to leave said aluminum film only in said opening and said wiring trench as a connection and a second wiring layer.

24. A method of forming a connection to a wiring layer comprising the steps of:

forming a first wiring layer on a first insulating film;

forming a second insulating film on said first wiring layer and said first insulating film;

forming an opening in said second insulating film to expose a portion of said first wiring layer;

forming a wiring trench communicating to said opening in said second insulating film;

forming a first metal layer on said first wiring layer and wiring trench;

depositing a silicon film on said second insulating film, which fills said opening and wiring trench;

removing said silicon film on said second insulating film to leave said silicon film in said opening and said wiring trench;

forming an aluminum film on said silicon film and said second insulating film;

performing a thermal process to cause aluminum from said aluminum film to migrate and replace the silicon film in said opening and said wiring trench; and removing completely any remaining unmigrated portion of said aluminum film from a surface of said second insulating film to leave said aluminum film only in said opening and said wiring trench as a connection and a second wiring layer.

* * * * *

UNITED STATES PATENT AND TRADEMARK OFFICE
CERTIFICATE OF CORRECTION

PATENT NO.:     5,994,218
DATED:          November 30, 1999
INVENTORS:      Shigeki SUGIMOTO, *et al.*

It is certified that errors appear in the above-identified patent and that said Letters Patent is hereby corrected as shown below:

On the cover page, right column, line 3, delete "Lee" and insert --Somekh et al.--.

In Claim 1, column 5, line 27, delete "filing" and insert --filling--.

In Claim 21, column 7, line 12, after "removing", insert --completely--.

line 16, after "film", insert --only --

Signed and Sealed this

Twenty-fifth Day of July, 2000

*Attest:*

Q. TODD DICKINSON

*Attesting Officer*          *Director of Patents and Trademarks*